US008679934B2

(12) United States Patent
Liu

(10) Patent No.: US 8,679,934 B2
(45) Date of Patent: Mar. 25, 2014

(54) METHOD FOR MAKING A BOTTOM ELECTRODE GEOMETRY FOR PHASE CHANGE MEMORY

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 323 days.

(21) Appl. No.: 13/212,456

(22) Filed: Aug. 18, 2011

(65) Prior Publication Data

US 2011/0299329 A1    Dec. 8, 2011

Related U.S. Application Data

(62) Division of application No. 11/512,858, filed on Aug. 30, 2006, now Pat. No. 8,003,972.

(51) Int. Cl.
*H01L 21/20* (2006.01)

(52) U.S. Cl.
USPC ..... 438/381; 438/380; 438/382; 257/E21.004

(58) Field of Classification Search
USPC ................ 438/380, 381, 382; 257/E21.004
See application file for complete search history.

(56) References Cited

U.S. PATENT DOCUMENTS

| | | | | |
|---|---|---|---|---|
| 5,687,112 A * | 11/1997 | Ovshinsky | | 365/163 |
| 6,737,312 B2 | 5/2004 | Moore | | |
| 6,800,563 B2 * | 10/2004 | Xu | | 438/718 |
| 6,894,305 B2 | 5/2005 | Yi et al. | | |
| 6,982,913 B2 | 1/2006 | Oh et al. | | |
| 7,042,001 B2 | 5/2006 | Kim et al. | | |
| 7,071,021 B2 | 7/2006 | Harshfield et al. | | |
| 2003/0071255 A1 | 4/2003 | Xu | | |
| 2003/0127669 A1 | 7/2003 | Doan et al. | | |
| 2003/0189200 A1 * | 10/2003 | Lee et al. | | 257/1 |
| 2004/0077123 A1 * | 4/2004 | Lee et al. | | 438/102 |
| 2004/0113232 A1 * | 6/2004 | Johnson et al. | | 257/529 |
| 2004/0115372 A1 * | 6/2004 | Lowrey | | 428/34.1 |
| 2004/0175857 A1 * | 9/2004 | Lowrey et al. | | 438/95 |
| 2006/0023497 A1 | 2/2006 | Kawazoe et al. | | |
| 2006/0054878 A1 * | 3/2006 | Lowrey | | 257/3 |
| 2006/0271755 A1 | 11/2006 | Miura | | |
| 2007/0138595 A1 * | 6/2007 | Hsu et al. | | 257/536 |
| 2007/0148855 A1 * | 6/2007 | Chen et al. | | 438/238 |

FOREIGN PATENT DOCUMENTS

| | | |
|---|---|---|
| EP | 1 065 736 | 1/2001 |
| EP | 1 331 675 | 7/2003 |

OTHER PUBLICATIONS

S. Hudgens and B. Johnson, "Overview of Phase-Change Chalcogenide Nonvolatile Memory Technology," *MRS Bulletin*, Nov. 2004, pp. 829-832.

(Continued)

*Primary Examiner* — Bilkis Jahan
(74) *Attorney, Agent, or Firm* — Leffert Jay & Polglaze, P.A.

(57) ABSTRACT

A PCRAM cell has a gradated or layered resistivity bottom electrode with higher resistivity closer to a phase change material, to provide partial heating near the interface between the cell and the bottom electrode, preventing separation of the amorphous GST region from the bottom electrode, and reducing the programming current requirements. The bottom electrode can also be tapered to have a smaller cross-sectional area at the top of the bottom electrode than at the bottom of the bottom electrode.

20 Claims, 8 Drawing Sheets

(56) References Cited

OTHER PUBLICATIONS

S.H. Lee, et al., "Full Integration and Cell Characteristics for 64Mb Nonvolatile PRAM," *Symposium on VLSI Technology Digest of Technical Papers,* 2004, pp. 20-21.

Stefan Lai, "Current status of the phase change memory and its future," *IEDM '03 Technical Digest,* Dec. 2003, pp. 10.1.1-10.1.4.

A.L. Lacaita, "Phase change memories: State-of-the-art, challenges, and perspectives," *Solid-State Electronics,* 2006, pp. 24-31.

Matthias Wuttig, "Phase-Change Materials; Towards a universal memory?" *Nature Materials,* Apr. 2005, pp. 265-266.

* cited by examiner

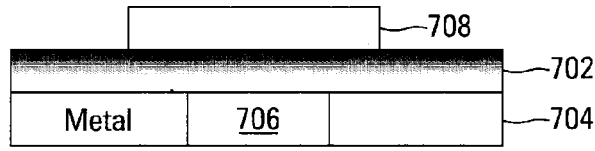
FIG. 7A
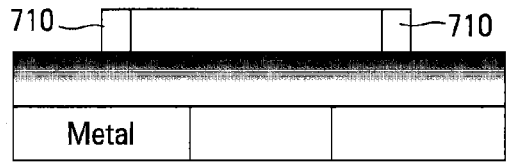
FIG. 7B
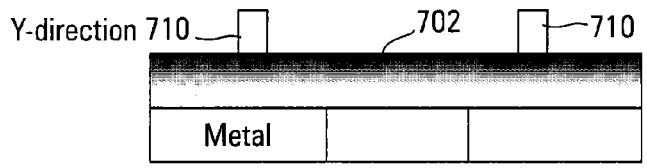
FIG. 7C
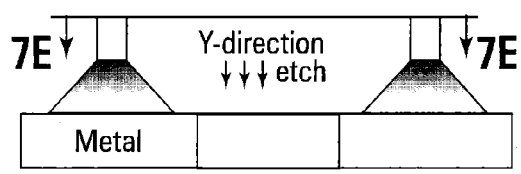
FIG. 7D
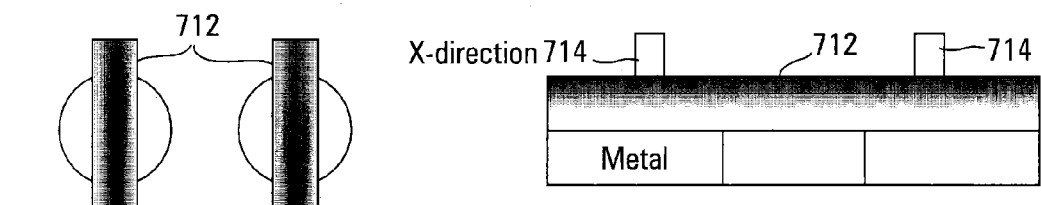
FIG. 7E
FIG. 7F
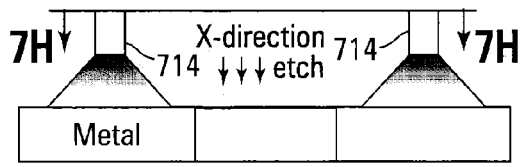
FIG. 7G
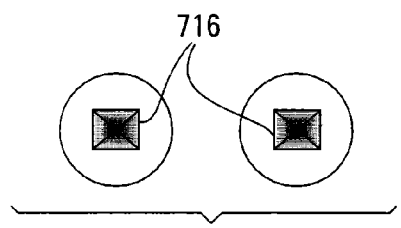
FIG. 7H

METHOD FOR MAKING A BOTTOM ELECTRODE GEOMETRY FOR PHASE CHANGE MEMORY

RELATED APPLICATION

This Application is a Divisional of U.S. application Ser. No. 11/512,858 titled "BOTTOM ELECTRODE GEOMETRY FOR PHASE CHANGE MEMORY," filed Aug. 30, 2006, now U.S. Pat. No. 8,003,972 (allowed) which is commonly assigned and incorporated herein by reference.

FIELD

The present disclosure relates generally to phase change memories and in particular the present disclosure relates to phase change memory electrodes.

BACKGROUND

Phase change random access memory (PCRAM) is a non-volatile form of memory that uses the reversible process of changing the state of an alloy containing one or more elements from Group V or VI of the periodic table between amorphous and crystalline states upon application of an electric current, and wherein the two states have substantially different electrical resistance. Typical current phase change memories use a chalcogenide alloy, such as a Germanium-Antimony-Tellurium (GeSbTe, or GST, most commonly $Ge_2Sb_2Te_5$) alloy. The amorphous (a-GST) and crystalline (c-GST) states of the material have largely different resistivity, on the order of three orders of magnitude, so that a determination of the state is easily done. The crystalline state has typical resistance on the order of kiloOhms (kΩ), whereas the amorphous state has typical resistance on the order of megaOhms (MΩ). The states are stable under normal conditions, so the PCRAM cell is a non-volatile cell with a long data retention. When the GST is in its amorphous state, it is said to be RESET. When the GST is in its crystalline state, it is said to be SET. A PCRAM cell is read by measuring its resistance.

The structure of a typical vertical PCRAM cell in a SET state 100 as shown in FIG. 1 includes a bottom metal contact 102, a bottom electrode 104 surrounded by dielectric material 106, a chalcogenide (GST) 108 having a crystalline portion (c-GST) 112, a top electrode 114, a metal top contact 116, and a cell select line 118. The GST 108 being all c-GST means that the GST has a high conductivity, and low resistance, typically on the order of kΩ. The bottom electrode 104 is sometimes referred to as a heater.

A RESET structure of the PCRAM cell 100 is shown in FIG. 2. The bottom electrode 104 is typically a high conductivity, low resistivity metal or alloy (less than 1 milliOhms·cm (mΩ·cm)). To change the cell 100 from a SET state to a RESET state, a current is passed through the bottom metal contact 102 and bottom electrode 104. This current heats a programmable volume region of the GST 108 near the top of the bottom electrode 104 to a temperature sufficient to melt the GST in that region. Typical melting points for many GST materials are in the range of 600 degrees C., although the melting point differs for other chalcogenides. When the current is removed, a section of the programmable volume of GST 108 that has been heated to its melting point rapidly cools due to heat dissipation into the surrounding materials. This rapid cooling does not allow the melted programmable volume region to cool in a crystalline state. Instead, a region of amorphous GST (a-GST 110) remains at or near the top of the heater 104.

The desired a-GST region is a hemispherical region covering the top of the bottom electrode 104 and extending slightly into the field of c-GST. This allows for a high resistance of the GST 108, as the resistances of the c-GST 112 and a-GST 110 portions behave electrically as series a connected resistance. This is shown in FIG. 3.

The majority of the heat generated by the current passing through the bottom electrode 104 does not contribute to heating of the GST 108, since the heat is dissipated by the surrounding dielectric material 106. Therefore, most of the heating of the programmable volume region of GST 108 is due to resistive heating near the top of the heater 106.

In typical PCRAM cells, the cell (the GST layer) and the top electrode are patterned together with the current flowing from the top electrode contact to the bottom electrode. In this arrangement, current density is mostly symmetric. In an ideal RESET state, a hemispheric region of GST covering the entire area of the bottom electrode contact is converted to the amorphous state (a-GST 110), to prevent a parallel leakage path.

The hottest region in the GST programmable volume is typically about 20 nanometers above the interface between the bottom electrode 104 and the GST 108 due to heat loss through bottom electrode 104. The inefficient heating of low resistance bottom electrodes 104 combined with the hottest region being above the interface between the bottom electrode 104 and the GST 108 can create an amorphous GST region that is separated from the bottom electrode as shown in FIG. 4. This leads to a parallel resistance connection for the a-GST and c-GST regions, and the current flows though the low resistance path of the parallel circuit, the result being that the cell is stuck at a low resistance state and the GST cannot be converted back to a high resistance state.

Still further, a RESET current pulse that is too large will form an ideal hemispherical amorphous region covering the bottom electrode 104, but will create a region of the GST that is too hot, often in excess of 900 degrees C. This hot spot can cause bubbling, sublimation, or composition change.

To switch the cell 100 from a RESET state to a SET state, a SET current is passed through the metal contact 102 and bottom electrode 104 to heat the a-GST section 110 near the top of the bottom electrode 104 to a temperature below the melting point, but sufficiently high (on the order of 350 degrees C. for typical GST materials, but different for other chalcogenides) at which the mobility of atoms in the region near the top of the bottom electrode 104 allows them to rearrange from an amorphous state to a crystalline state. The resulting configuration has a GST 108 that is all crystalline, as is shown in FIG. 1.

The currents used to SET and RESET the cell are typically as follows. A SET state is achieved by applying a voltage or current pulse sufficient to raise the GST temperature in the programmable volume to below the melting point but above its crystallization temperature, and is held for a sufficient time to allow the rearranging of the atoms to a crystalline state. A RESET state is achieved by applying a voltage or current pulse sufficient to raise the GST temperature in the programmable volume to the melting point, and is held typically for a shorter time than the SET pulse. The SET pulse is typically longer in duration but of lower amplitude than the RESET pulse. The RESET pulse is typically shorter in duration but of higher amplitude than the SET pulse. The actual amplitudes and durations of the pulses depend upon the size of the cells and the particular phase change materials used in the cell. RESET currents for many GST cells are currently in the 400 to 600 microAmpere (μA) range, and have durations in the 10-50 nanosecond range, whereas SET currents are currently in the 100 to 200 μA range and have durations in the 50-100 nanosecond range. Read currents are lower than either SET or RESET currents. As cell size continues to decrease, the currents involved and the durations thereof also continue to decrease.

For the reasons stated above, and for other reasons stated below which will become apparent to those skilled in the art upon reading and understanding the present specification, there is a need in the art for improved PCRAM structures and methods for phase change memory switching.

BRIEF DESCRIPTION OF DRAWINGS

FIGS. 7A to 7H are in-process cross-sectional views of formation of a phase change memory cell according to another embodiment;

DETAILED DESCRIPTION

Figure 1:
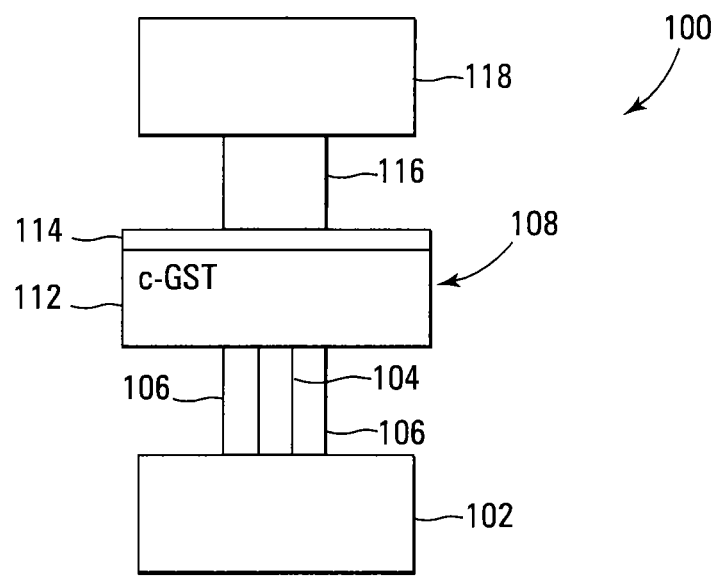
FIG. 1 is a cross-sectional view of a typical phase change memory cell in a SET state.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the embodiments. Other embodiments may be utilized and structural, logical, and electrical changes may be made without departing from the scope of the application.

The following detailed description is, therefore, not to be taken in a limiting sense, and the scope of the present disclosure is defined only by the appended claims, along with the full scope of equivalents to which such claims are entitled.

Plug bottom electrodes of PCRAM cells are often of a shape that slopes from the bottom of the bottom electrode toward the top, with the electrode having a larger cross-sectional area at the top of the bottom electrode near the interface between the bottom electrode and the phase change material than at the bottom of the bottom electrode. This further contributes to inefficiency because for the same current through the plug, a larger cross-sectional area provides even less resistive heating than a smaller cross-sectional area. The current being equal, the resistance of the material at the lower part of the bottom electrode is higher, which generates more heat than the upper portion. This heat is quickly dissipated into the surrounding dielectric and does not contribute to heating of the programmable volume of the phase change material.

Embodiments disclosed herein use a gradated or layered resistivity bottom electrode of a PCRAM cell to increase the contribution of the bottom electrode to heating of a programmable region of a phase change material of the cell. Still further, the bottom electrode is patterned as a conical-like shape with smaller cross sectional area at the interface between the bottom electrode and the GST of the PCRAM cell. While GST is used in the description herein, it should be understood that other phase change materials including other chalcogenides, are amenable to use with the various embodiments. For example only, phase change materials include but are not limited to GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, and the like. For purposes of this application, resistivity refers to electrical resistivity.

Figure 2:
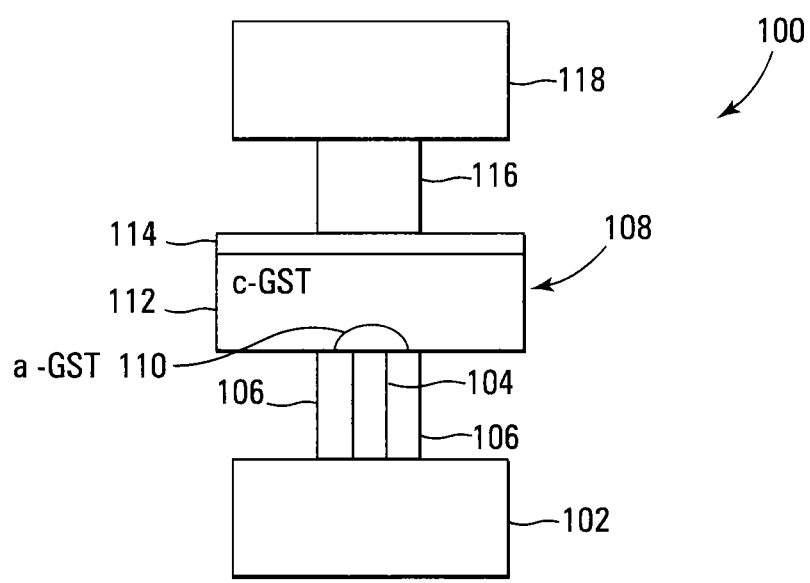
FIG. 2 is a cross-sectional view of a typical phase change memory cell in a RESET state.
Figure 4:
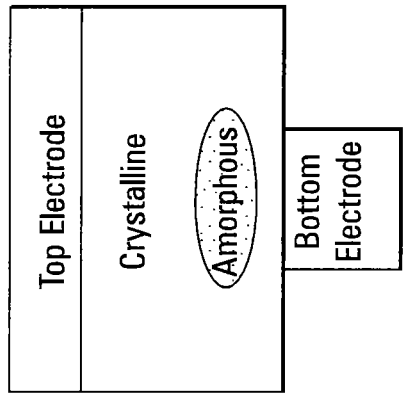
FIG. 4 is a partial cross-sectional view of a failure state RESET structure in a phase change memory cell.
Figure 4:
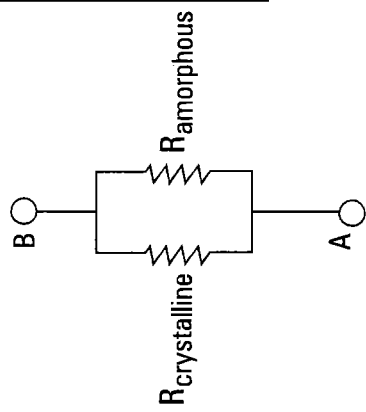
Figure 3:
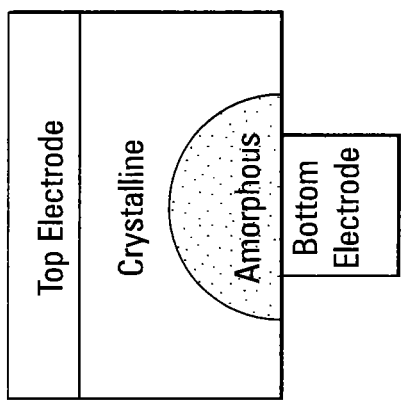
FIG. 3 is a partial cross-sectional view of a desired RESET structure in a phase change memory cell.
Figure 3:
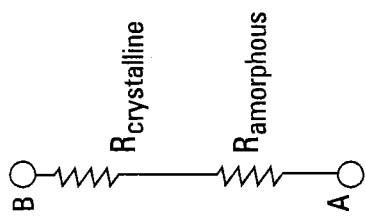
Figure 5:
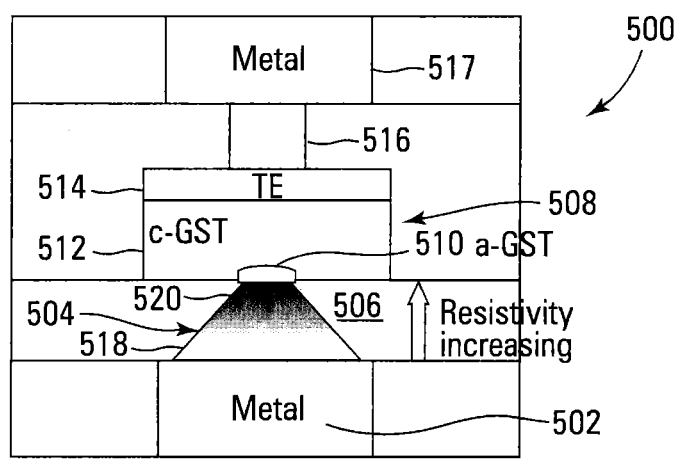
FIG. 5 is a cross-sectional view of a vertical phase change memory cell according to one embodiment.

FIG. 5 shows a vertical PCRAM cell 500 in cross section. Cell 500 includes a mostly typical set of components similar to those shown in FIGS. 1 and 2, and operates under the same general principles. A lower metal contact 502 has thereon a bottom electrode 504 surrounded by dielectric material 506. A phase change material 508, such as a chalcogenide or GST material, is above the bottom electrode 504, and is topped with a top electrode 514, a top metal contact 516, and a cell select line 517. The phase change material 508 is shown in FIG. 5 having an amorphous region 510 and a crystalline region 512. The bottom electrode 504 has a tapered cross section, and a resistivity gradient from its bottom 518 toward its top 520. The resistivity of the bottom electrode 504 increases from a lower resistivity at bottom 518 to a high resistivity at top 520.

The bottom electrode 504 is shown as tapered in FIG. 5, but it should be understood that an increasing resistivity bottom electrode without the conical-like shape also provides an increased amount of heat at the interface between the bottom electrode 504 and the phase change material 508. This is because the smallest cross-sectional area and the highest resistivity of the bottom electrode is closest to the programmable volume of the phase change cell material. The lower resistivity of the lower portion of the bottom electrode reduces heat loss to the surrounding dielectric 506, and reduces the likelihood of parasitic series resistance from the bottom electrode 504.

Figure 6:
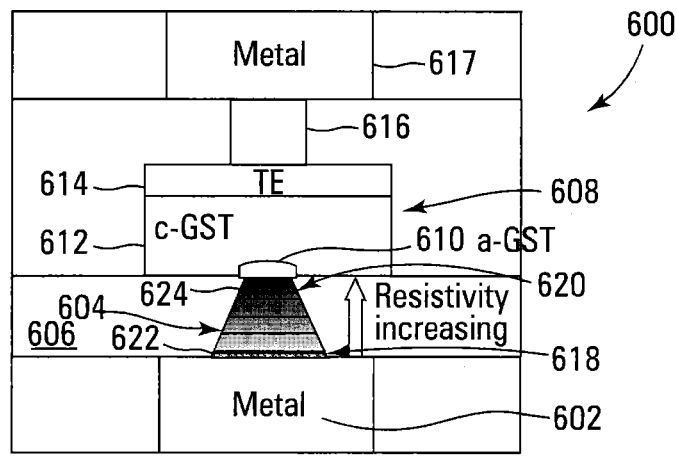
FIG. 6 is a cross-sectional view of a vertical phase change memory cell according to another embodiment.

FIG. 6 shows another vertical PCRAM cell 600 in cross section. Cell 600 includes a mostly typical set of components similar to those shown in FIGS. 1 and 2, and operates under the same general principles. A lower metal contact 602 has thereon a bottom electrode 604 surrounded by dielectric material 606. A phase change material 608, such as a chalcogenide or GST material, is above the bottom electrode 604, and is topped with a top electrode 614, a top metal contact 616, and a cell select line 617. The phase change material 608 is shown in FIG. 6 having an amorphous region 610 and a crystalline region 612. The bottom electrode 604 has a tapered cross section, and a plurality of layers of material having increasing resistivity, with the lowest resistivity layer 622 at the bottom 618 of the bottom electrode 604 and the highest resistivity layer 624 at the top 620 of bottom electrode 604.

The bottom electrode 604 is shown as tapered in FIG. 6, but it should be understood that increasing resistivity layers of the bottom electrode without the conical-like shape also provides an increased amount of heat at the interface between the bottom electrode 604 and the phase change material 608. This is because the smallest cross-sectional area and the highest resistivity layer of the bottom electrode is closest to the programmable volume of the phase change cell material. The lower resistivity of the lower layers of the bottom electrode reduces heat loss to the surrounding dielectric 606, and reduces the likelihood of parasitic series resistance from the bottom electrode 604.

One problem with simply making the entire heater a high resistivity material is that partial heating of the cell GST will occur, but a majority of the heat generated by the current passing through the high resistivity heater will be dissipated into the surrounding dielectric without contributing to the heating of the GST material. Further, power consumption will increase due to the high amounts of voltage required to get current to the GST region through the high resistivity heater element.

The bottom electrode 504 is in various embodiments formed of a substance that can easily be given a resistively gradient during formation, for example, TiN, ZrN, HfN, VN, NbN, TaN, TiAlN, TaSiN, TiCN, and the like. Resistivity of materials such as TiN, ZrN, HfN, VN, NbN, TaN, TiAlN, TaSiN, TiCN, and the like can be increased by a few orders of magnitude during deposition by increasing the concentration of Nitrogen. This increase in Nitrogen concentration can be accomplished, for example, by adjusting Nitrogen-containing gas ratio during chemical vapor deposition or physical vapor deposition of the bottom electrode material or low energy Nitrogen plasma source implantation. Examples of resistivity differences between the bottom of the bottom electrode and the top of the bottom electrode are for example, less than 1 milliOhm·cm at the bottom to upwards of 6 or more milliOhm·cm at higher Nitrogen concentrations. The bottom electrode 604 is in various embodiments formed in layers of increasing resistivity.

The high resistivity material close to the GST programmable volume creates a partial heating of the GST programmable volume by the resistive heating at the electrode tops 520 and 620. This heating serves to move the hottest region of the GST closer to the interface between the bottom electrodes 504 and 604 and the GST 508 and 608, and to prevent the formation of an amorphous region of GST separated from the tops of the bottom electrodes 504 and 604. It also helps to reduce the programming current requirement of phase change memory cells.

The embodiments herein concentrate heating due to the bottom electrodes 504 and 604 at their tops where the high resistivity material is, that is, near the interface between the bottom electrodes 504 or 604 and the GST 508 or 608. The heat produced by the high resistivity material at the tops of bottom electrodes 504 and 604 is close to the cell interface, and provides efficient heating of the programmable volume, and prevents the formation of a crystalline GST region between the bottom electrodes 504, 604 and the amorphous GST region formed at the tops of the bottom electrodes 504, 604. Further, since high electrical resistivity material has a lower thermal conductivity than low electrical resistivity material, the traditional heat sink effect of a low electrical resistivity heater element is reduced at or near the interface between the heater element and the GST. In combination, the programming current requirements can also be reduced.

A bottom electrode according to one embodiment includes an electrode that tapers from its largest cross-sectional area to its smallest cross-sectional area between a bottom metal contact and the phase change cell material. As the cross-sectional area decreases, reaching its smallest area at the interface between the bottom electrode and the phase change cell material, with an equal current, the opposite effect of traditional bottom electrodes occurs. For the same current, the resistance of the bottom electrode is at its highest at the interface between the bottom electrode and the phase change cell material. Therefore, the top of the bottom electrode, closest to the phase change material, generates more heat than the lower portion of the electrode.

In another embodiment, a gradated resistivity material is used for forming the bottom electrode. The resistivity of the bottom electrode is increased the closer the portion of the electrode is to the interface between the bottom electrode and the phase change cell material. That is, the resistivity increases from the bottom of the bottom electrode toward the top of the bottom electrode. The increased resistivity provides a higher heat concentration at the top of the electrode, where it is most able to provide heat to the programmable volume of the phase change cell material. Gradation of material is accomplished through known deposition techniques for increasing concentration of dopants in a material during deposition, for example.

In another embodiment, instead of a bottom electrode with a resistivity gradient, a series of layers of increasing resistivity are deposited, the lowest resistivity material being in the lowest layer of the bottom electrode, with increasing resistivity layers toward the top of the bottom electrode. The highest resistivity layer is at the top of the bottom electrode, where it contributes the most toward heating the programmable volume of the phase change material at the interface between the bottom electrode and the phase change cell material.

In other embodiments, a gradated resistivity bottom electrode or a layered resistivity electrode such as those described above are combined with a tapered bottom electrode, also as described above. This provides a tapered bottom electrode having a smaller cross-sectional area at the top of the bottom electrode versus the bottom of the bottom electrode, as well as gradated or layered resistivity, which further increases the heating close to the phase change cell material, and reduces heat loss to surrounding dielectrics in the lower portions of the bottom electrode.

The bottom electrodes 504 and 604 described above can be formed in a number of ways. FIGS. 7A to 7H show the formation of an electrode such as electrode 504 in a series of in-process cross-sectional views. During formation of the PCRAM cell 500, a layer of bottom electrode material 702 is deposited over metal contacts and substrate 704 and 706, followed by, for example, a photoresist layer 708 or a sacrificial dielectric layer. Spacers 710 are deposited using, for example, a chemical vapor deposition process, and are shown in FIG. 7B. The spacers 710 are aligned in the Y direction, and following appropriate etching to remove layer 708, the spacers 710 remain, and are centered over the metal contacts 704 in the Y direction as shown in FIG. 7C. The spacers can be made to sizes smaller than current lithography techniques will allow, with dimensions of 20 nanometers or smaller. Using an etch, such as a reactive ion etching process, as shown in the Y directions in FIG. 7D, bottom electrode material 712 remains, in a structure tapered along the Y direction, as shown in FIG. 7E. The spacers 710 are removed. Next, spacers 714 are deposited in similar fashion as spacers 710 described above, but in the X direction as is shown in FIG. 7F. Using another etch, as shown in the X direction in FIG. 7G, bottom electrodes 716 (like bottom electrodes 504 and 604) remain, and the sacrificial spacers are subsequently removed.

The bottom electrodes 716 are shown in top view in FIG. 7H with a tapered shape smaller at their tops and larger at their bottoms. Etching to allow tapered structures is accomplished in a variety of ways, including angling the ion source to create tapered structures, and the like, and will not be described further herein. Following the formation of the cone-like bottom electrodes 716, dielectric is deposited between the electrodes and the structure is planarized, followed by deposition of the GST phase change layer and top metal contacts.

Formation of the PCRAM cell using a layered resistivity bottom electrode such as cell 604 is performed in much the same method as the formation of cell 500, except using a plurality of layers if increasing resistivity bottom electrode material as opposed to a gradated resistivity bottom electrode material.

Figure 8:
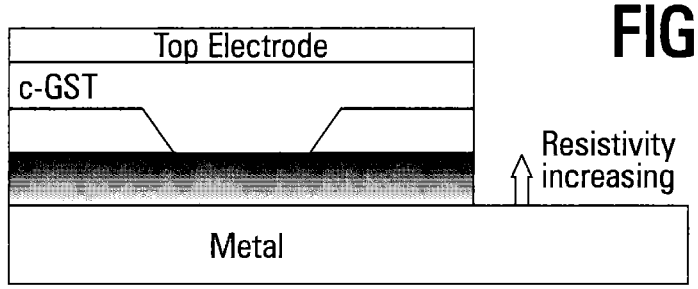
FIG. 8 is a cross-sectional view of a cell-in-the-via phase change memory cell according to one embodiment.
Figure 9:
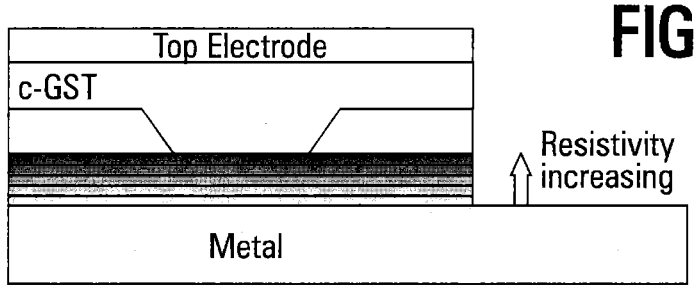
FIG. 9 is a cross-sectional view of a cell-in-the-via phase change memory cell according to another embodiment.

The various embodiments have been shown with vertical PCRAM cells. The layered or gradated resistivity electrodes are also provided with cell-in-the-via PCRAM cells, such as those shown in FIGS. 8 and 9. Cell-in-the-via structures have a bottom electrode larger than the GST cell size. A resistivity gradient or layered resistivity layers with increasing resistivity near the top of the bottom electrode provides increased heating at the interface between the bottom electrode and the phase change cell material.

Figure 10:
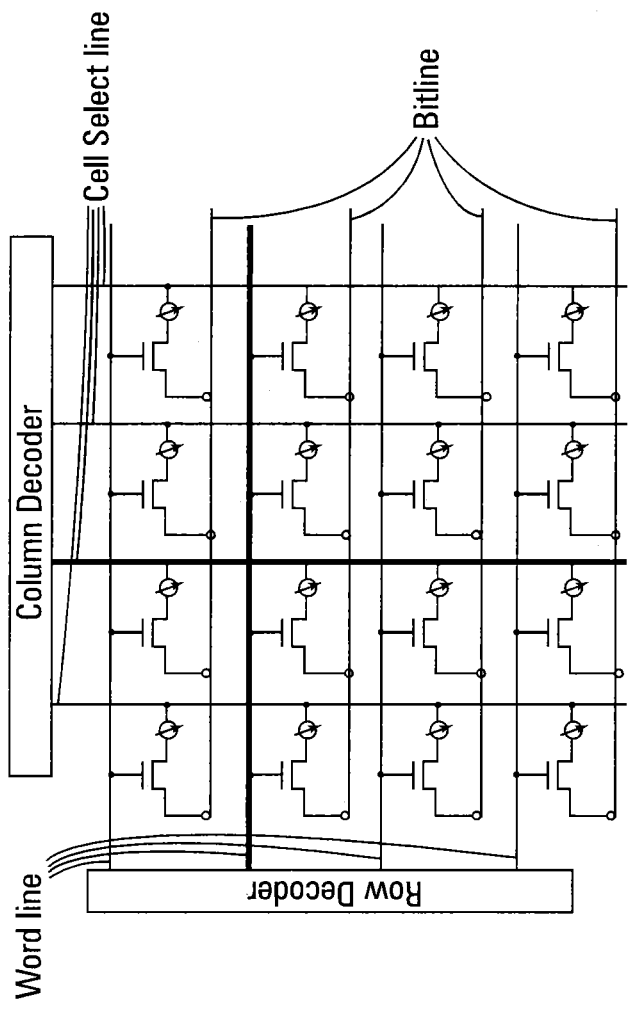
FIG. 10 is a simplified circuit diagram of a portion of a memory array according to another embodiment.
Figure 10:
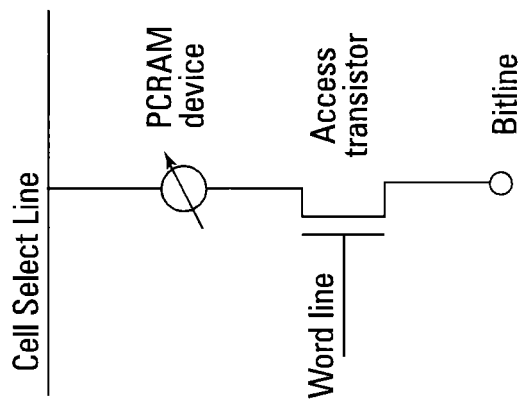

PCRAM memory arrays can take several different forms, each of which are amenable to use with the bottom electrode cap configuration PCRAM cells described above. Examples of PCRAM memory arrays include an array of PCRAM cells each comprising an access transistor (metal oxide semiconductor field effect transistor (MOSFET) or bipolar transistor) and one PCRAM cell, in other words a 1T1C configuration. The resistance of the PCRAM cell can be switched between high and low states by resetting the GST of the cell to an amorphous state (high resistance) or setting the cell to a crystalline state (low resistance). Both set and reset currents are provided through the access transistor. An example of a portion of a PCRAM array of this type is shown in FIG. 10. A cell is selected by selecting its corresponding word line and cell select line. Bitlines may be tied to a common voltage source or individually selected. To RESET a cell, a large short pulse is applied to the corresponding cell select line while its word line is turned on. The RESET current flows through the selected memory element and resets the cell. To SET a cell, a smaller but longer pulse is applied to the cell select line to heat the memory element above its crystallization temperature but below its melting point. To read a cell, a voltage smaller than the threshold switching voltage of amorphous phase change material is applied to the cell select line.

Figure 11:
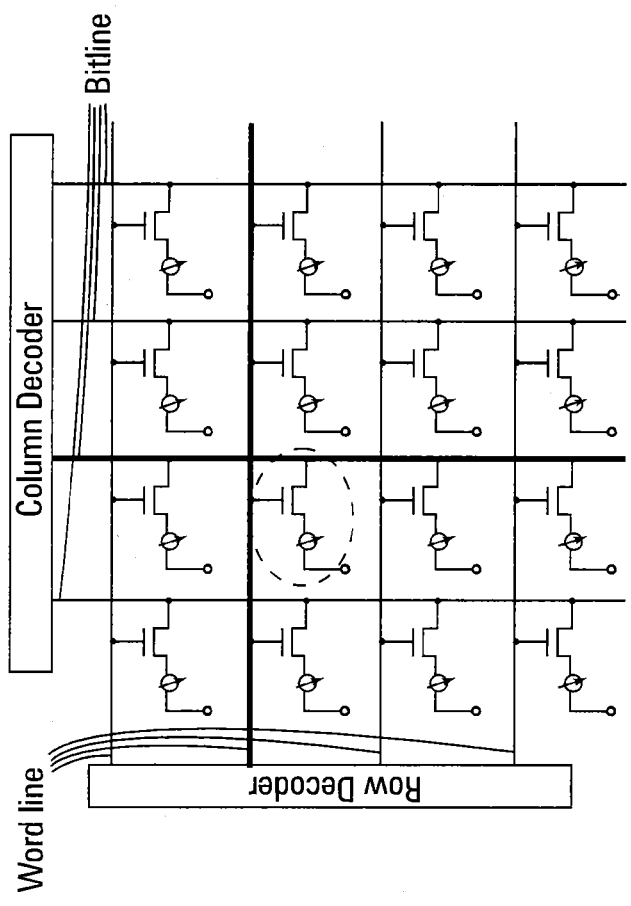
FIG. 11 is a simplified circuit diagram of a portion of a memory array according to another embodiment.
Figure 11:
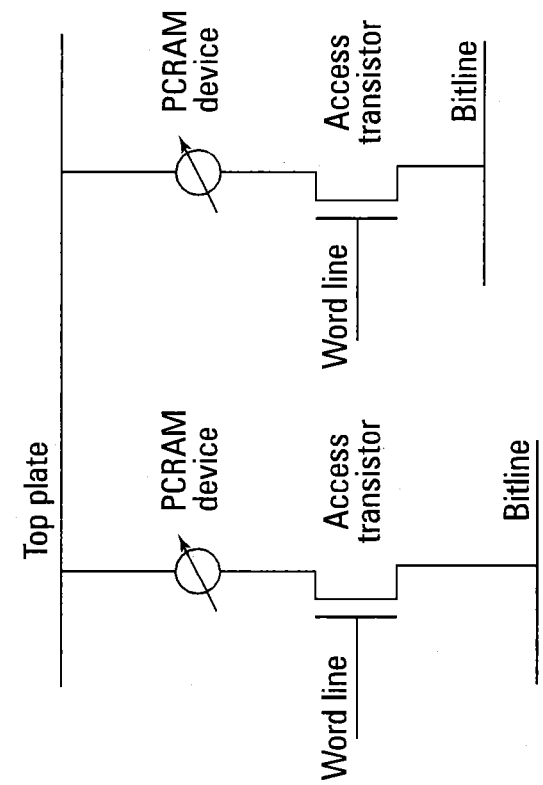

Another PCRAM memory array uses a large block of phase change material and a top electrode, and is shown in general in FIG. 11. A common voltage is applied to the top electrode to bias all memory bits. A memory element is selected by selecting its word line and bitline.

Figure 12:
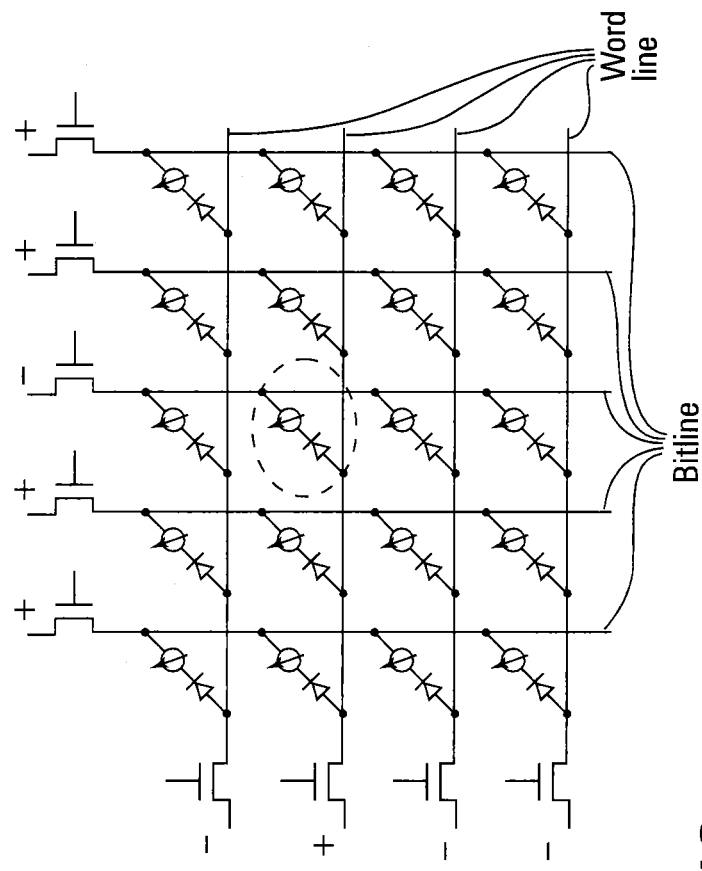
FIG. 12 is a simplified circuit diagram of a portion of a memory array according to another embodiment.
Figure 12:
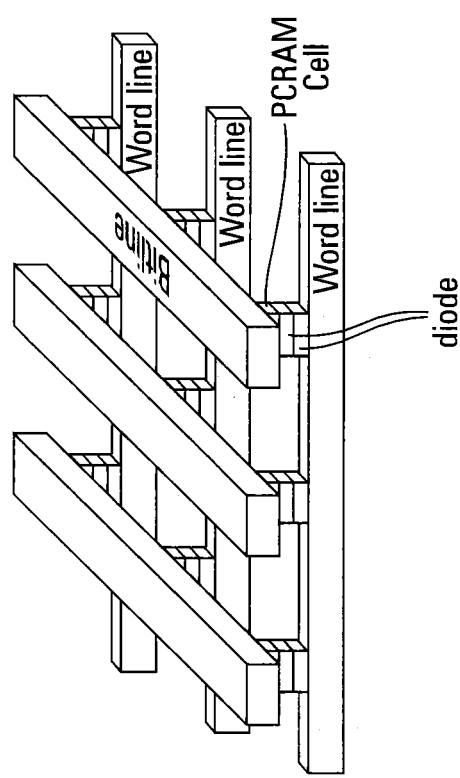

Yet another PCRAM memory array is shown in FIG. 12. Diode-accessed cross-point PCRAM arrays select a memory element by biasing its word line high and non-selected word lines low, while biasing its selected bitline low and non-selected bitlines high. Only the diode connected to the selected cell is forward biased. All other diodes are reverse biased or do not have sufficient bias to overcome their threshold voltage, and no current flows except in the selected cell.

PCRAM arrays can be used in various memory devices, and may be coupled to a processor or memory controller, and may form part of an electronic system, including but not limited to memory modules for computers, cameras, portable storage devices, digital recording and playback devices, PDAs, and the like.

Conclusion

PCRAM cells and methods of forming them have been described that include tapered and untapered gradated resistivity bottom electrodes; and tapered or untapered layered resistivity bottom electrodes, to provide localized heating of a GST layer of the cell, preventing separation of an amorphous GST region from the top of the bottom electrode. Tapered and untapered electrodes are provided in vertical PCRAM cells. Untapered electrodes are provided in cell-in-the-via PCRAM cells. Further, programming current requirements are reduced.

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the embodiments. Therefore, it is manifestly intended that this application be limited only by the claims and the equivalents thereof.

What is claimed is:

1. A method of forming a phase change memory cell, comprising:
    forming a bottom electrode having a resistivity gradient with increasing resistivity between a bottom of the bottom electrode and a top of the bottom electrode;
    forming a phase change memory element above the bottom electrode; and
    forming a top electrode over the phase change memory element.

2. The method of claim 1, wherein the bottom electrode with resistivity gradient is formed using a process of increasing Nitrogen concentration in the bottom electrode material to increase resistivity.

3. The method of claim 1, wherein forming the bottom electrode comprises forming the bottom electrode as a single layer.

4. The method of claim 1, wherein the bottom electrode is formed with a gradated resistivity having a lower resistivity at a bottom of the bottom electrode and gradually increasing in resistivity to a substantially higher resistivity at a top of the bottom electrode.

5. The method of claim 1, wherein the bottom electrode is formed in a conical shape with a cross-sectional area that decreases toward the top of the bottom electrode.

6. The method of claim 1, wherein the bottom electrode is formed having a resistivity less than 1 milliohm·cm at the bottom of the bottom electrode.

7. The method of claim 1, wherein the bottom electrode is formed having a resistivity greater than 1 milliOhm·cm at the top of the bottom electrode.

8. The method of claim 1, wherein the phase change material is formed from a chalcogenide.

9. The method of claim 1, wherein the phase change material is formed from a Germanium-Antimony-Tellurium alloy.

10. A method of forming a phase change memory cell, comprising:
    forming a resistivity gradated layer of bottom electrode material over a metal contact, the resistivity gradated layer having increasingly high resistivity from a lowest resistivity at a bottom of the bottom electrode to a highest resistivity at a top of the bottom electrode; and
    tapering the bottom electrode to a shape having its largest cross-sectional area at its lowest resistivity and its smallest cross-sectional area at its highest resistivity.

11. The method of claim 10, wherein forming the resistivity gradated layer comprises forming a single layer.

12. The method of claim 10, wherein forming the resistivity gradated layer comprises forming a layer having a resistivity less than 1 milliOhm·cm at the bottom of the bottom electrode and a resistivity greater than 1 milliOhm·cm at the top of the bottom electrode.

13. The method of claim 10, wherein tapering the bottom electrode further comprises tapering to a conical shape.

14. The method of claim 10, wherein the bottom electrode with resistivity gradient is formed using a process of increasing Nitrogen concentration in the bottom electrode material to increase resistivity.

15. The method of claim 10, wherein the bottom electrode is formed having a resistivity less than 1 milliOhm·cm at the bottom of the bottom electrode.

16. The method of claim 10, wherein the bottom electrode is formed having a resistivity greater than 1 milliOhm·cm at the top of the bottom electrode.

17. The method of claim 10, wherein the phase change material is formed from a chalcogenide.

18. The method of claim 10, wherein the phase change material is formed from a Germanium-Antimony-Tellurium alloy.

19. A method of forming a phase change memory cell, comprising:
    forming a resistivity gradated layer of bottom electrode material over a metal contact, the resistivity gradated layer having increasingly high resistivity from a lowest resistivity at a bottom of the bottom electrode to a highest resistivity at a top of the bottom electrode;
    forming a phase change memory element above the bottom electrode; and
    forming a top electrode over the phase change memory element.

20. The method of claim 19, and further comprising tapering the bottom electrode to a conical shape having its largest cross-sectional area at its lowest resistivity and its smallest cross-sectional area at its highest resistivity.

* * * * *

UNITED STATES PATENT AND TRADEMARK OFFICE
CERTIFICATE OF CORRECTION

PATENT NO. : 8,679,934 B2  
APPLICATION NO. : 13/212456  
DATED : March 25, 2014  
INVENTOR(S) : Jun Liu Page 1 of 1

It is certified that error appears in the above-identified patent and that said Letters Patent is hereby corrected as shown below:

In the Claims

In column 8, line 47, in claim 6, delete "milliohm.cm" and insert -- milliOhm.cm --, therefor.

Signed and Sealed this
Twenty-ninth Day of July, 2014

Michelle K. Lee
*Deputy Director of the United States Patent and Trademark Office*